United States Patent
Pahl (10) Patent No.: US 9,084,366 B2
(45) Date of Patent: Jul. 14, 2015

(54) ELECTRIC COMPONENT HAVING A SHALLOW PHYSICAL SHAPE, AND METHOD OF MANUFACTURE

(75) Inventor: Wolfgang Pahl, Munich (DE)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 13/698,350

(22) PCT Filed: May 16, 2011

(86) PCT No.: PCT/EP2011/057889
§ 371 (c)(1),
(2), (4) Date: Jan. 28, 2013

(87) PCT Pub. No.: WO2011/144570
PCT Pub. Date: Nov. 24, 2011

(65) Prior Publication Data
US 2013/0121523 A1 May 16, 2013

(30) Foreign Application Priority Data
May 20, 2010 (DE) .......................... 10 2010 022 204

(51) Int. Cl.
*H04R 1/02* (2006.01)
*H04R 19/00* (2006.01)
(Continued)

(52) U.S. Cl.
CPC .................. *H05K 1/183* (2013.01); *H04R 1/02* (2013.01); *H04R 19/005* (2013.01); *H05K 13/04* (2013.01); *H01L 2224/16225* (2013.01); *H01L 2224/48137* (2013.01); *H01L 2224/48227* (2013.01); *H01L 2224/73265* (2013.01); *H01L 2924/1461* (2013.01); *H01L 2924/3011* (2013.01); *Y10T 29/49002* (2015.01)

(58) Field of Classification Search
CPC .... H04R 19/005; H04R 19/04; H04R 19/016; H04R 1/02; H04R 1/406; H04R 2201/003; H01L 2924/1461; B81B 2201/0257; B81B 2207/012; B81B 7/0048; B81C 2203/0154
USPC .................. 381/360–361, 355, 369; 361/761; 438/51, 55
See application file for complete search history.

(56) References Cited

U.S. PATENT DOCUMENTS

| | | | |
|---|---|---|---|
| 6,088,463 | A | 7/2000 | Rombach et al. |
| 6,324,067 | B1 | 11/2001 | Nishiyama |

(Continued)

FOREIGN PATENT DOCUMENTS

| | | |
|---|---|---|
| CN | 201345734 Y | 11/2009 |
| DE | 69626747 T2 | 5/1997 |

(Continued)

OTHER PUBLICATIONS

International Search Report corresponding to co-pending International Patent Application Serial No. PCT/EP2011/057889, European Patent Office, dated Sep. 8, 2011; (2 pages).

*Primary Examiner* — Ahmad F Matar
*Assistant Examiner* — Norman Yu
(74) *Attorney, Agent, or Firm* — Nixon Peabody LLP (57) ABSTRACT

Electric components and methods of manufacture are specified. An electric component comprises a carrier having a recess which penetrates the carrier and also a first chip and external contact area. The first chip is arranged in the recess in the carrier. The external contact area is provided for connecting up the first chip to an external circuit environment.

17 Claims, 3 Drawing Sheets

(51) Int. Cl.
*H05K 13/04* (2006.01)
*H05K 1/18* (2006.01)

(56) References Cited

U.S. PATENT DOCUMENTS

| | | | |
|---|---|---|---|
| 6,522,762 | B1 | 2/2003 | Mullenborn et al. |
| 6,781,231 | B2 | 8/2004 | Minervini |
| 7,396,739 | B2 | 7/2008 | Joodaki |
| 2001/0005601 | A1 | 6/2001 | Shin et al. |
| 2004/0057589 | A1* | 3/2004 | Pedersen et al. .............. 381/152 |
| 2007/0121972 | A1 | 5/2007 | Suzuki et al. |
| 2008/0279407 | A1* | 11/2008 | Pahl .............................. 381/355 |
| 2008/0298621 | A1* | 12/2008 | Theuss et al. ................. 381/360 |
| 2009/0001553 | A1 | 1/2009 | Pahl et al. |
| 2009/0016550 | A1* | 1/2009 | Qiao ............................. 381/175 |
| 2011/0018076 | A1 | 1/2011 | Pahl et al. |
| 2011/0186943 | A1 | 8/2011 | Pahl et al. |
| 2012/0093346 | A1 | 4/2012 | Feiertag et al. |

FOREIGN PATENT DOCUMENTS

| | | |
|---|---|---|
| DE | 19810756 A1 | 9/1999 |
| DE | 102005007423 B3 | 6/2006 |
| DE | 102005002751 A1 | 8/2006 |
| DE | 102005053765 A1 | 5/2007 |
| DE | 102008007682 A1 | 12/2008 |
| DE | 102009019446 A1 | 11/2010 |
| JP | 2002083890 A | 3/2002 |
| JP | 2006294825 A | 10/2006 |
| JP | 2007184415 A | 7/2007 |
| JP | 2008270777 A | 11/2008 |
| WO | 2009/092361 A2 | 7/2009 |

* cited by examiner

ELECTRIC COMPONENT HAVING A SHALLOW PHYSICAL SHAPE, AND METHOD OF MANUFACTURE

CROSS-REFERENCE TO RELATED APPLICATIONS

This application is a U.S. National Stage of International Application No. PCT/EP2011/057889, filed May 16, 2011, which claims the benefit of Germany Patent Application No. 10 2010 022 204.6, filed on May 20, 2010, both of which are incorporated herein by reference in their entireties.

The invention relates to electric components having a shallow physical shape, and to methods for manufacturing such components.

Electric components are subject to high pressure for miniaturization and for saving costs. Modern electric components can be manufactured cost-effectively if they are manufactured in a multiple panel and/or using wafers. Electric components can be used as microphones, e.g. as MEMS microphones.

Electric components can be manufactured using wafers all the more expediently, the more components are arranged in the multiple panel in the wafer. The provision of a larger number of, in particular shallow, components per wafer requires thin wafers having a larger radius. Such wafers are all the more mechanically unstable, the thinner they are and the larger their radius; consequently, thinning is possible only to a certain degree. Particularly thin wafers are sensitive to warpage, unevennesses and fracture.

U.S. Pat. No. 6,781,231 B2 discloses MEMS microphones wherein an MEMS chip is mounted on a carrier and is covered by a cap.

U.S. Pat. No. 6,088,463 and U.S. Pat. No. 6,522,762 B1 disclose MEMS chips comprising electric components. Here chips lie opposite one another on opposite sides of a carrier.

US 2008/0279407 A1 discloses MEMS microphones having a reduced installation height.

The height of the components mentioned in said documents in each case results at least from the sum of the height of the MEMS chip and of an associated carrier on which the MEMS chip is mounted.

What is problematic about known electric components, and in particular MEMS components, is often their excessively large structural height.

Therefore, it is an object of the present invention to specify an electric component of shallow design which can be manufactured expediently. In particular, the manufacture of corresponding components is intended to be compatible with efficient multiple panel processes for low item costs.

This object is achieved according to the invention by means of an electric component according to aspects disclosed herein and by means of a method of manufacture according to aspects disclosed herein.

An electric component comprises a carrier having a cutout, and also a first chip and a first contact area. In this case, the cutout penetrates through the carrier. The chip is arranged in the cutout. The external contact area is provided for an interconnection of the first chip with an external circuit environment.

It has been recognized that with such an electric component having a carrier having a cutout therein, both a relatively high mechanical stability and a low physical shape can be obtained simultaneously if the chip is arranged in the cutout. Therefore, it is no longer necessarily the case that, for the total height of the component, the height of the carrier substrate also has to be added to the height of the chip component. This is because, by virtue of the fact that the chip is arranged in the cutout of the carrier, and by virtue of the fact that the cutout penetrates through the carrier, the structural height of the component according to the invention is determined solely by the individual component part (carrier of chip) having the greater height.

By way of example, if the structural height of the chip is greater than the structural height of the carrier, then the structural height of the chip limits the total height of the electric component. Such a component can have a thicker carrier than conventional components since a carrier embodied with greater thickness does not adversely influence the total height of the component as long as this is lower than that of the chip. Consequently, a mechanically stabler component can be obtained despite a lower physical shape.

In principle, a cutout penetrating through a carrier weakens the carrier to a greater extent in comparison with a carrier without a cutout or without a penetrating cutout. However, if the carrier is made thicker for compensation, then the elevation of the carrier can compensate for the structural weakening by the cutout or even bring about a mechanically stabler component. Thinning processes during manufacture, e.g. by etching carrier and/or chip, which would structurally weaken the carrier material can be substantially or wholly dispensed with since a component that is as shallow as possible is obtained anyway.

Thinning processes that are nevertheless required can be carried out more simply and more rapidly since, owing to the higher starting thickness, a structural weakening is no longer so significant, as a result of which manufacturing costs can be saved.

The external contact area can be arranged on the surface of the chip or on the surface of the carrier.

In one embodiment, an electric component comprises an adhesive, which is arranged in a gap between the first chip and the cutout. The adhesive connects the first chip to the carrier.

The first chip can be fitted into the cutout with an accurate fit. Provision can also be made for the cutout to be larger than the chip. A gap then exists between the carrier and the chip. An adhesive can then connect the carrier to the chip in a force-locking manner. The fundamental structural weak point of the carrier, the cutout, is then mechanically stabilized by the chip since the chip can absorb and transmit mechanical forces. It turns out that a corresponding electric component has a surprisingly high mechanical stability despite a continuous cutout. This is the case, specifically, even when the carrier is not made particularly thick.

Appropriate adhesives include liquid resins which assume their final material and connecting properties after polymerization to form a solid molding material. Curing can in this case be initiated by the admixture of a curing agent, by increasing the temperature or by UV radiation. Appropriate liquid resins include epoxy, silicone, phenolic, urethane and acrylic resins. The adhesive, which connects the carrier to the chip, can also be a hot melt adhesive if the carrier material and the chip material are sufficiently heat-resistant. Furthermore, solvent-based adhesives are also suitable as the adhesive.

It is also possible, however, to connect the carrier having the cutout and the chip to form a mechanically stable component without adhesive. For this purpose, prior to connection the carrier can be brought to a higher temperature than the chip; the cutout is enlarged in comparison with the chip on account of thermal expansion. Alternatively, the chip can be cooled to a lower temperature; the chip is analogously reduced in size. In both cases, the carrier is hotter than the chip. Afterward, the chip is inserted into the cutout. If carrier and chip are at the same temperature, the chip "is seated" mechanically stably in the cutout.

In one embodiment, the electric component comprises a cutting, which is arranged on a part of the surface of the carrier or of the first chip. The coating is selected such that it supports a wetting of this part of the surface with an adhesive. Said part of the surface may include, in particular, those parts of the surface at which an adhesive connecting the carrier to the chip is intended to adhere.

The adhesive can be applied as a viscous adhesive into a gap between the first chip and the carrier. A gap can be arranged between the carrier and the chip, which gap encloses the chip in a ring-shaped manner. However, it is also possible for the chip to touch the carrier at one, two or more sides and for only those sides of the chip and of the carrier between which a gap is arranged to be wetted with an adhesive.

The chip can comprise a covering. The covering can be arranged on that side of the chip which faces the carrier—namely the mounting side—or on that side of the chip which faces away from the carrier. In this case, such a covering can protect the membrane or the backplate of an MEMS chip. In particular, it is possible that a covering fitted to that side of an MEMS chip which faces the carrier protects MEMS structures such as e.g. the membrane or the backplate against contact with the adhesive.

The adhesive can be applied, for example, by direct dispensing or by jetting. In this case, the adhesive can be forced from a supply container by means of hollow needles or tubes and can be applied or sprayed onto the corresponding surfaces of the carrier or of the chip, where it adheres.

If the electric component comprises a coating which supports wetting of the surface with an adhesive, then a more homogeneous distribution of the adhesive in the gap is achieved. Besides such a flow-promoting coating, the distribution of the adhesive can also be accelerated by heating.

An additional adhesive deposit can be provided at a mounting location for a further chip.

In one embodiment, an electric component comprises a cover, which covers a part of the top side of the carrier, in particular the cutout, or a part of the top side of the first chip. It is also possible for the cover to cover the entire top side of the carrier—and thus also the entire top side of the first chip. For this purpose, the carrier can comprise an edge which surrounds and projects beyond the chip and on which the cover is seated. Consequently, the cover together with the edge of the carrier can enclose a cavity, in which the first chip is arranged. A hermetic encapsulation of the top side of the chip can thus be achieved. If the underside of the chip is also covered by a lower cover, then a complete hermetic encapsulation of the chip can be achieved.

The cover can comprise a rigid film, which is laminated on during the production of the component, e.g. in the multiple panel. In the case of a shallow housing body or if the chip is higher than the carrier, a cap-shaped covering can cover corresponding parts of the surface of the carrier or of the chip.

In one embodiment, the carrier has a multilayered construction comprising two or more dielectric layers and a metallization layer arranged therebetween. Conductor tracks or impedance elements are structured in the metallization layer. An internal interconnection interconnects the first chip, the impedance elements or the conductor tracks and the external contact area.

The dielectric layers can comprise HTCC (High Temperature Cofired Ceramics) or LTCC (Low Temperature Cofired Ceramics).

In this case, the carrier embodied in multilayered fashion can comprise further contact areas, via which conductor tracks or impedance elements of the carrier are interconnected with contact areas of the chip. In this case, one or a plurality of external contact areas can be provided for an interconnection with an external circuit environment.

The electric component can be provided for use with RF (Radio-Frequency) signals. Impedance elements in the multilayered carrier can then produce an impedance matching or an impedance transformation between the external contact area or an external circuit environment and circuit elements of the first chip that are possibly present.

In this case, besides conductor tracks, the internal interconnection can also comprise bonding wires, bump connections and plated-through holes.

In one embodiment, an electric component also comprises at least one further chip besides the first chip. A further chip can be, for example, an ASIC chip (Application Specific Integrated Circuit). In one embodiment, an electric component comprises an ASIC chip, which is fixed to the carrier and is interconnected via an internal interconnection with the first chip. The further chip, too, can be arranged in a further cutout. Usually, however, an IC chip has a smaller structural height than an MEMS chip, for example, such that the additional height of the latter does not significantly increase the total height of the component.

The first chip can be an MEMS chip having MEMS component structures. The ASIC chip can then comprise circuits for controlling the component structures or for evaluating data signals generated by the component structures.

In one embodiment, the first chip is an MEMS chip having a membrane and a backplate. A back volume is arranged in the carrier or in the MEMS chip. The electric component can be a microphone. Such an MEMS microphone therefore comprises a membrane and a backplate, wherein generally an electrical bias voltage is present between the membrane and the backplate. The ASIC chip comprises circuits which control the electrical bias voltage or which can evaluate electrical signals which code acoustic signals.

In general, MEMS microphones must comprise a back volume adjacent to the backplate or the membrane. Such a back volume generally enlarges the physical shape of an MEMS microphone. The present invention specifies an MEMS microphone having a shallow physical shape, wherein the back volume is arranged, for example, within a closed volume substantially alongside the MEMS chip. In particular, it is not absolutely necessary that the existence of the back volume increases the total structural height of the MEMS microphone.

Three-dimensionally molded bodies provided with interconnects, so-called MIDS (Molded Interconnected Devices), are further possibilities for configuring elements with an internal interconnection. The carrier can furthermore comprise organic laminates such as e.g. FR4. Contact areas, e.g. SMD soldering pads or wire bonding pads, can be arranged as external contact areas on a lower or an upper top side of the carrier.

The first chip or further chips such as, for example, ASIC chips can be interconnected with the internal interconnection by means of wire bonding technology or flip-chip technology. A residual adhesive deposit of the adhesive which connects the first chip to the carrier can remain at a location on the carrier and be provided for receiving a further chip.

It is also possible to arrange the carrier on an auxiliary film, then to arrange an adhesive on that part of the auxiliary film which is not covered in the region of the cutout, and thereupon to arrange the first chip into the cutout on the adhesive such that the adhesive fills the gap between the carrier and the first chip.

A method for producing an electric component having a shallow physical shape comprises the following steps:
providing a carrier having a cutout penetrating through the carrier,
providing a first chip,
arranging the carrier on an auxiliary film,
arranging the first chip in the cutout,
fixing the first chip in the cutout.

In one embodiment of the method, the film has, on the side facing the carrier and the chip, an adhesive layer which is continuous or, if appropriate, applied in a structured fashion.

An exact positioning of the carrier and of the first chip on the film is thus improved. In particular, the risk of sliping after the arrangement is reduced.

One embodiment of the method furthermore comprises the following steps:
providing a cover film,
structuring a cover from the cover film,
arranging the cover on a part of the carrier or of the chip.

An auxiliary film used during production can remain at the electric component after production. However, it can also be removed again.

By means of suitable grooves, reservoirs, channels or similar structurings of the carrier, the adhesive can be applied into the gap more easily and be distributed better there.

The sound entrance opening of a microphone can be formed by means of masked plasma etching. Laser drilling, particularly in the case of oblique incidence of radiation, is also possible. Oblique incidence of radiation can prevent the laser beam from impinging on the sensitive membrane during penetration.

Concrete details of electric components according to the invention are explained more specifically below on the basis of exemplary embodiments and associated schematic figures.

Figure 1:
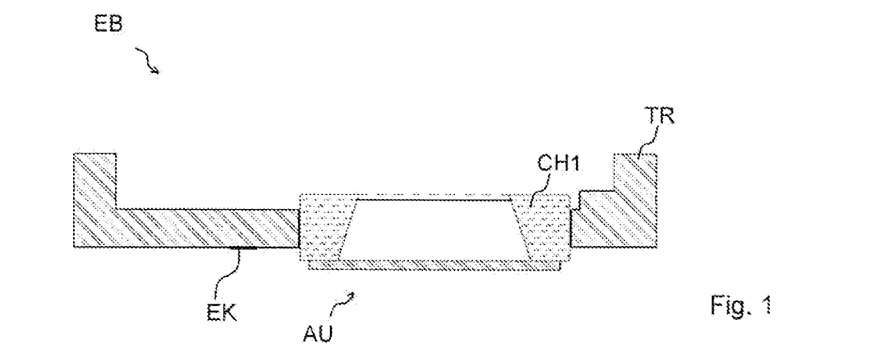
FIG. 1 shows a basic shape of the electric component.

FIG. 1 shows an electric component EB comprising a carrier TR and a first chip CH1. A cutout AU is arranged in the carrier TR. In this case, the cutout AU completely penetrates through the carrier TR. The electric component EB furthermore comprises an external contact area EK. The external contact area EK is provided for an interconnection of the first chip CH1 with an external circuit environment. In the example shown in FIG. 1, the first chip CH1 is an MEMS microphone chip. By virtue of the fact that the first chip is arranged in the cutout which completely penetrates through the carrier TR, the total structural height of the electric component is reduced in comparison with known components, without the need to reduce the mechanical stability.

Figure 2:
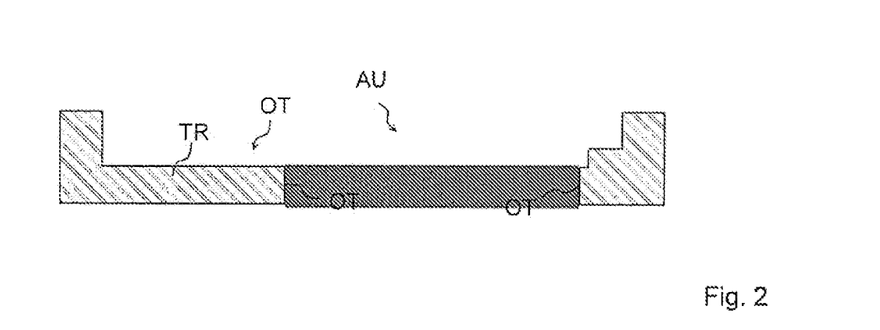
FIG. 2 shows a carrier with a continuous cutout.

FIG. 2 shows a carrier TR of an electric component, wherein a cutout AU is arranged in the carrier TR, which cutout penetrates through the carrier TR in a vertical direction. The carrier TR has a surface OT. In particular, an edge region around the cutout AU is delimited by vertically oriented sections of the surfaces OT. The significance of the surfaces of the carrier TR which delimit the cutout AU is explained in greater detail in the following figures and concerns the joining together of carrier TR and chip CH1.

Figure 3:
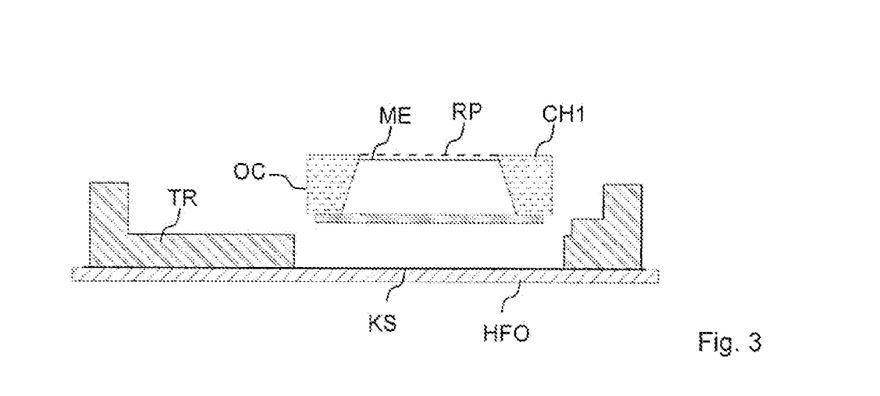
FIG. 3 shows a carrier of an electric component, which carrier is arranged on a film, while a chip is just being inserted into the cutout.

FIG. 3 shows a carrier TR arranged on an auxiliary film HFO. FIG. 3 captures the moment at which the first chip CH1 is just being inserted into the cutout AU during a production process. The first chip CH1 comprises a membrane ME and a backplate RP. Furthermore, a thin adhesive layer KS is arranged on the auxiliary film HFO, and supports the arrangement of the carrier TR and the first chip CH1 on the auxiliary film HF1. The first chip has a surface OC. Once the first chip CH1 has been arranged in the cutout, mutually parallel sections of the surface OC of the first chip and of the surface OT of the carrier TR are opposite one another in the cutout.

Figure 4:
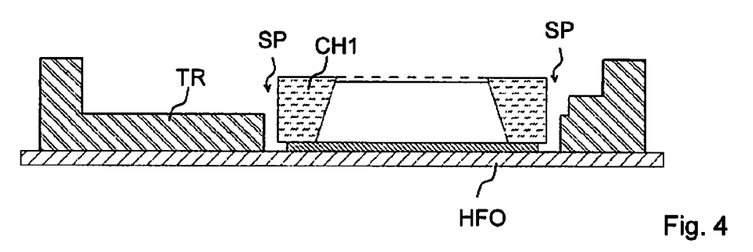
FIG. 4 shows the arrangement of a carrier and of a chip on a film, wherein a gap is arranged between the carrier and the chip.

FIG. 4 shows a first chip CH1 arranged in the cutout in the carrier TR. The first chip CH1 and the carrier TR are arranged on an auxiliary film HFO. The first chip CH1 is arranged in the cutout such that a gap SP between the carrier TR and the first chip CH1 surrounds the first chip CH1 along a closed path.

Figure 5:
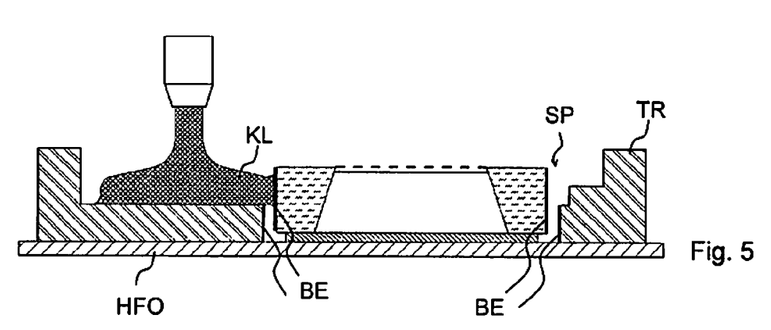
FIG. 5 shows the application of an adhesive for connecting the chip to the carrier.

FIG. 5 shows the application of an adhesive KL, which is intended to connect the carrier TR to the chip. The chip and the carrier TR are arranged on an auxiliary film HFO. Those sections of the surfaces of the chip and of the carrier TR which are opposite one another in the cutout comprise a coating BE. The coating BE supports the coating of the corresponding parts of the surfaces of the carrier TR and of the chip with an adhesive KL. In this case, the adhesive KL is applied such that it connects the chip to the carrier TR in a force-locking manner after curing. The coating helps when wetting the corresponding parts of the surfaces with the adhesive.

Figure 6:
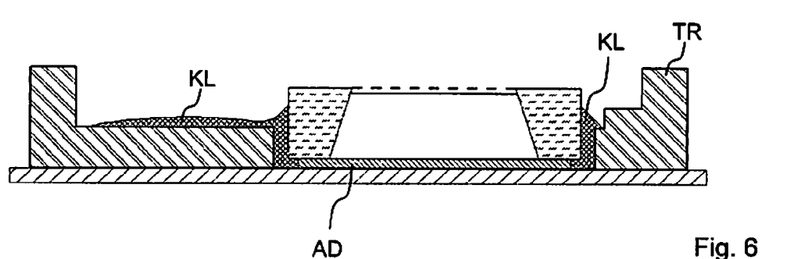
FIG. 6 shows an electric component wherein the chip is connected to the carrier by means of an adhesive.

FIG. 6 shows an electric component wherein an adhesive KL connects the chip to the carrier TR along a closed path around the chip. The total structural height of the electric component is reduced; at the same time, the mechanical stability—since the chip can absorb and transmit mechanical forces is not reduced.

A covering AD is arranged at the underside of the chip. Component structures or other elements of the chip, e.g. a membrane, a back volume or a backplate, are thereby protected. In particular, component structures or elements are protected against contact with the adhesive KL. However, it is also possible to cover the top side of the chip with a protective covering.

Figure 7:
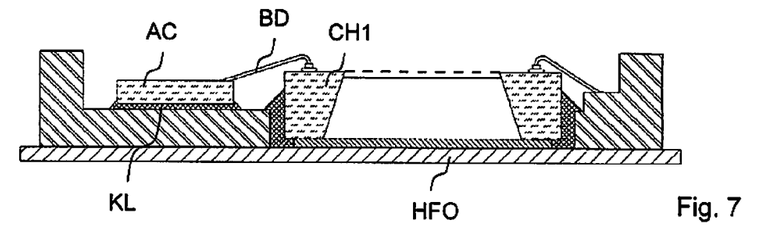
FIG. 7 shows an electric component wherein a further chip is adhesively bonded onto the carrier.

FIG. 7 shows an electric component which also comprises a further chip AC besides the first chip CH1. The further AC is an ASIC chip. The ASIC chip AC is connected to the carrier by means of an adhesive KL. The first chip CH1 and the ASIC chip AC are interconnected by means of bonding wires BD.

Figure 8:
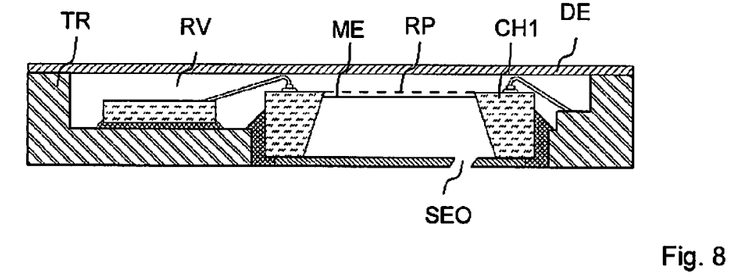
FIG. 8 shows an MEMS microphone having a sound entrance opening, wherein a back volume is covered by a cover.

FIG. 8 shows an electric component wherein the top side of an MEMS chip and of a further chip are covered by a cover DE. The cover DE covers a back volume RV. The back volume RV is completely enclosed by the cover, by the carrier, by the adhesive and by the first chip and thus hermetically closed off from the environment of the electric component. The first chip, an MEMS chip, comprises a sound entrance opening SEO at its underside. The first chip CH1 comprises a membrane ME and a backplate RP. Consequently, the electric component constitutes an MEMS microphone having a shallow structural height and high mechanical stability.

Figure 9:
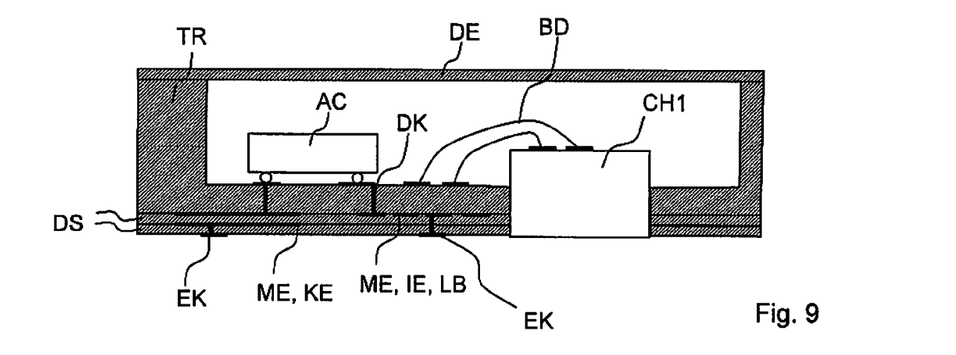
FIG. 9 shows an electric component comprising a carrier embodied in multilayered fashion.

FIG. 9 shows a configuration of the electric component, wherein the carrier TR is embodied in a multilayered fashion. The carrier TR comprises dielectric layers DS. Metallization layers ME are arranged between the dielectric layers. Capacitive elements KE and inductive elements IE are structured in the metallization layers ME. Contact areas of the first chip are interconnected with contact areas of the carrier TR by means of bonding wires BD. Inductive elements IE arranged within the carrier substrate TR and capacitive elements KE arranged within the carrier substrate TR are interconnected with external contact areas EK on the underside of the carrier TR and with the ASIC chip AC via plated-through holes DK or conductor tracks LB. Bonding wires BD, impedance elements IE, KE within the carrier TR embodied in a multilayered fashion, bump connections between the ASIC chip AC and the carrier TR and further encompassed metallization lines constitute the internal interconnection of the electric component.

An electric component according to the invention is not restricted to any of the exemplary embodiments described. Combinations of different features and variations which comprise e.g. even further circuit elements, chips or cutouts likewise constitute exemplary embodiments according to the invention.

LIST OF REFERENCE SIGNS

AC: ASIC chip
AD: Covering
AU: Cutout
BD: Bonding ware
BE: Coating
CH1: First chip
DE: Cover
DK: Plated-through hole
DS: Dielectric layer
EB: Electric component
EK: External contact area
HFO: Auxiliary film
IE: Inductive element
KE: Capacitive element
KL: Adhesive
KS: Adhesive layer
LB: Conductor track
ME: Membrane
MS: Metallization layer
OC: Surface of the chip
OT: Surface of the carrier
RP: Backplate
RV: Back volume
SEO: Sound entrance opening
SP: Gap
TR: Carrier

The invention claimed is:

1. An electric component having a shallow physical shape, the electric component being a microphone comprising
a carrier having a cutout, a first chip and an external contact area, wherein
the cutout having a section, the section penetrating through the carrier,
the first chip is arranged in the cutout, the section being filled with the first chip, the first chip being a Microelectromechanical Systems (MEMS) chip,
the external contact area is provided for an interconnection of the first chip with an external circuit environment,
wherein the carrier has a depression leading to the cutout, the depression defining a hollow space when covered by a cover,
wherein the carrier includes a sidewall forming the depression, the electric component further comprising a second chip electrically connected to the first chip and disposed in the hollow space, and
wherein a height contribution of the carrier and of the first chip to the height of the electric component when the first chip is arranged in the cutout is less than a sum of the height of the carrier plus the height of the first chip.

2. The electric component according to claim 1, furthermore comprising an adhesive, which is arranged in a gap between the first chip and the cutout and connects the first chip to the carrier.

3. The electric component according to claim 1, further comprising a coating, which is arranged on a part of the surface of the carrier or of the first chip and which can support a wetting of the part of the surface with an adhesive.

4. The electric component according to claim 1, further comprising a cover, which covers a part of the top side of the carrier or a part of the top side of the first chip.

5. The electric component according to claim 1, wherein
the carrier has a multilayered construction comprising two dielectric layers and a metallization layer arranged therebetween,
conductor tracks or impedance elements are structured in the metallization layer and
an internal interconnection interconnects the first chip the impedance elements and the external contact area.

6. The electric component according to claim 1, further comprising an ASIC chip, which is fixed to the carrier and is interconnected via an internal interconnection with the first chip.

7. The electric component according to claim 1, wherein
the first chip has a membrane and a backplate, and
a back volume is arranged in the carrier or in the MEMS chip.

8. A method for manufacturing an electric component comprising a first chip and a carrier for carrying the first chip, the electric component being a microphone having a shallow physical shape, comprising the following steps in the following order of:
providing the carrier having a cutout penetrating through the carrier,
providing the first chip, wherein the first chip is a Microelectromechanical Systems (MEMS) chip,
arranging (a) the carrier on an auxiliary film and (b) the first chip in the cutout, and
fixing the first chip in the cutout.

9. The method according to claim 8, wherein the film has an adhesive layer on the side facing the carrier and the chip.

10. The method according to claim 9, further comprising the following steps of:
providing a cover film,
structuring a cover from the cover film, and
arranging the cover on a part of the carrier or of the chip.

11. The electric component according to claim 1, wherein the second chip is an ASIC chip, which is fixed to the carrier in the depression and is interconnected via an internal interconnection with the first chip.

12. The electric component according to claim 1, in which the cover, when present, covers a part of the top side of the carrier or a part of the top side of the first chip, the cover forming the hollow space.

13. The electric component according to claim 12, wherein
the first chip has a membrane and a backplate,
a back volume of the microphone is in the MEMS chip or is formed by the hollow space, and a height contribution of the carrier and of the MEMS chip to the height of the electric component when the MEMS chip is arranged in the cutout is less than a sum of the height of the carrier plus the height of the first chip.

14. The electric component according to claim 8, wherein a height contribution of the carrier and of the first chip to the height of the electric component when the first chip is arranged in the cutout is less than a sum of the height of the carrier plus the height of the first chip.

15. The electric component according to claim 8, further comprising an adhesive, which is arranged at least (1) in a gap between the first chip and the cutout and connects the first chip to the carrier and (2) on at least part of the bottom of the depression under the second chip.

16. The method according to claim 8, wherein the carrier has a depression, the cutout penetrating a bottom of the depression, wherein the carrier includes a sidewall forming the depression, the electric component further comprising a second chip electrically connected to the first chip and disposed in the hollow space.

17. The method according to claim 16, wherein a height contribution of the carrier, the first chip, and the second chip to the height of the electric component when the first chip is arranged in the cutout is less than a sum of the height of the carrier plus the height of the first chip.

* * * * *

UNITED STATES PATENT AND TRADEMARK OFFICE
CERTIFICATE OF CORRECTION

PATENT NO. : 9,084,366 B2
APPLICATION NO. : 13/698350
DATED : July 14, 2015
INVENTOR(S) : Wolfgang Pahl Page 1 of 1

It is certified that error appears in the above-identified patent and that said Letters Patent is hereby corrected as shown below:

In the Claims

In Column 9, Line 5 (Claim 14, Line 1), please delete "electric component" and insert --method-- therefor.

In Column 9, Line 10 (Claim 15, Line 1), please delete "electric component" and insert --method-- therefor.

Signed and Sealed this
Eighth Day of March, 2016

Michelle K. Lee
*Director of the United States Patent and Trademark Office*